US007465592B2

(12) United States Patent
Yoo (10) Patent No.: US 7,465,592 B2
(45) Date of Patent: Dec. 16, 2008

(54) METHOD OF MAKING VERTICAL STRUCTURE SEMICONDUCTOR DEVICES INCLUDING FORMING HARD AND SOFT COPPER LAYERS

(75) Inventor: Myung Cheol Yoo, Pleasanton, CA (US)

(73) Assignee: Verticle, Inc., Dublin, CA (US)

( * ) Notice: Subject to any disclaimer, the term of this patent is extended or adjusted under 35 U.S.C. 154(b) by 0 days.

(21) Appl. No.: 11/117,084

(22) Filed: Apr. 27, 2005

(65) Prior Publication Data

US 2005/0242365 A1 Nov. 3, 2005

Related U.S. Application Data

(60) Provisional application No. 60/566,322, filed on Apr. 28, 2004.

(51) Int. Cl.
*H01L 21/00* (2006.01)

(52) U.S. Cl. .............................. 438/22; 438/24; 438/30; 438/57; 438/68

(58) Field of Classification Search .................. 438/28, 438/46, 455, 22, 24, 30, 57, 68, 77; 257/E33.025, 257/80, 88, 94, 96

See application file for complete search history.

(56) References Cited

U.S. PATENT DOCUMENTS

| | | | |
|---|---|---|---|
| 4,999,694 A * | 3/1991 | Austin et al. ............... | 257/188 |
| 5,331,180 A | 7/1994 | Yamada et al. | |
| 5,912,477 A | 6/1999 | Negley | |
| 5,990,495 A | 11/1999 | Ohba | |
| 6,187,606 B1 | 2/2001 | Edmond et al. | |
| 6,201,262 B1 | 3/2001 | Edmond et al. | |
| 6,232,623 B1 | 5/2001 | Morita | |
| 6,281,867 B2 | 8/2001 | Kurematsu et al. | |
| 6,455,340 B1 | 9/2002 | Chua et al. | |

(Continued)

FOREIGN PATENT DOCUMENTS

JP 2005005421 A 1/2005

OTHER PUBLICATIONS

International Search Report, mailed Oct. 2, 2006, for International Application No. PCT/US2005/22785; Filed on Jun. 22, 2005; Applicant: Verticle.

(Continued)

*Primary Examiner*—Hsien-ming Lee
(74) *Attorney, Agent, or Firm*—IP Strategy Group, P.C.

(57) ABSTRACT

The invention provides a reliable way to fabricate a new vertical structure compound semiconductor device with improved light output and a laser lift-off processes for mass production of GaN-based compound semiconductor devices. A theme of the invention is employing direct metal support substrate deposition prior to the LLO by an electro-plating method to form an n-side top vertical structure. In addition, an ITO DBR layer is employed right next to a p-contact layer to enhance the light output by higher reflectivity. A perforated metal wafer carrier is also used for wafer bonding for easy handling and de-bonding. A new fabrication process is more reliable compared to the conventional LLO-based vertical device fabrication. Light output of the new vertical device having n-side up structure is increased 2 or 3 times higher than that of the lateral device fabricated with same GaN/InGaN epitaxial films.

21 Claims, 9 Drawing Sheets

U.S. PATENT DOCUMENTS

| | | | |
|---|---|---|---|
| 6,459,100 | B1 | 10/2002 | Doverspike et al. |
| 6,562,648 | B1 | 5/2003 | Wong et al. |
| 6,610,551 | B1 | 8/2003 | Doverspike et al. |
| 6,713,789 | B1 | 3/2004 | Shibata et al. |
| 6,744,196 | B1 | 6/2004 | Jeon |
| 6,756,614 | B2 * | 6/2004 | Hatano et al. ............... 257/192 |
| 7,105,857 | B2 * | 9/2006 | Nagahama et al. ............ 257/86 |
| 7,235,430 | B2 * | 6/2007 | Romano et al. ............. 438/122 |
| 7,250,638 | B2 | 7/2007 | Lee et al. |
| 2001/0010941 | A1 | 8/2001 | Morita |
| 2001/0042866 | A1 | 11/2001 | Coman et al. |
| 2002/0001943 | A1 | 1/2002 | Akram |
| 2002/0036295 | A1 | 3/2002 | Nunoue et al. |
| 2002/0050598 | A1 | 5/2002 | Otsuka et al. |
| 2002/0052076 | A1 | 5/2002 | Khan et al. |
| 2002/0053676 | A1 | 5/2002 | Kozaki |
| 2002/0056914 | A1 | 5/2002 | Akram |
| 2002/0098711 | A1 | 7/2002 | Klein et al. |
| 2002/0102819 | A1 | 8/2002 | Tamura et al. |
| 2002/0102830 | A1 | 8/2002 | Ishida |
| 2002/0106879 | A1 | 8/2002 | Akram |
| 2002/0117677 | A1 | 8/2002 | Okuyama et al. |
| 2002/0146855 | A1 | 10/2002 | Goto et al. |
| 2002/0182889 | A1 | 12/2002 | Solomon et al. |
| 2003/0006429 | A1 | 1/2003 | Takahashi et al. |
| 2003/0010975 | A1 | 1/2003 | Gibb et al. |
| 2003/0040133 | A1 | 2/2003 | Horng et al. |
| 2003/0047129 | A1 | 3/2003 | Kawahara et al. |
| 2003/0062530 | A1 | 4/2003 | Okazaki et al. |
| 2003/0080344 | A1 | 5/2003 | Yoo |
| 2003/0114017 | A1 | 6/2003 | Wong et al. |
| 2003/0122141 | A1 | 7/2003 | Wong et al. |
| 2003/0139037 | A1 | 7/2003 | Kobayashi et al. |
| 2003/0189212 | A1 | 10/2003 | Yoo |
| 2003/0189215 | A1 | 10/2003 | Lee et al. |
| 2003/0190770 | A1 | 10/2003 | Yeom et al. |
| 2003/0230757 | A1 | 12/2003 | Suehiro et al. |
| 2004/0072383 | A1 | 4/2004 | Nagahama et al. |
| 2004/0245543 | A1 | 12/2004 | Yoo |
| 2005/0082543 | A1 * | 4/2005 | Alizadeh et al. ............... 257/79 |
| 2005/0189551 | A1 * | 9/2005 | Peng et al. .................... 257/94 |
| 2006/0006554 | A1 | 1/2006 | Yoo |
| 2006/0105542 | A1 | 5/2006 | Yoo |
| 2006/0148115 | A1 | 7/2006 | Yoo |
| 2007/0221944 | A1 | 9/2007 | Yoo |

OTHER PUBLICATIONS

International Written Opinion, mailed Oct. 2, 2006, for International Application No.: PCT/US2005/22785; Filed on Jun. 22, 2005; Applicant: Verticle.

International Preliminary Report on Patentability, mailed Jan. 4, 2007, for International Application No.: PCT/US2004/017297; Filed on Jun. 3, 2004; Applicant: Yoo, Myung Cheol.

International Written Opinion, mailed Nov. 22, 2006, for International Appl. No.: PCT/US2004/017297; Filed on Jun. 3, 2004; Applicant: Yoo, Myung Cheol.

International Search Report, mailed Nov. 22, 2006, for International Application No.: PCT/US2004/017297; Filed on Jun. 3, 2004; Applicant: Yoo, Myung Cheol.

"Notice of Office Action," mailed Nov. 29, 2005, for U.S. Appl. No. 10/861,743; Filed on Jun. 3, 2004; Inventors: Yoo, Myung Cheol.

"Notice of Office Action," mailed Jun. 14, 2006, for U.S. Appl. No. 10/861,743; Filed on Jun. 3, 2004; Inventors: Yoo, Myung Cheol.

"Notice of Office Action," mailed Jan. 4, 2007, for U.S. Appl. No. 10/861,743; Filed on Jun. 3, 2004; Inventors: Yoo, Myung Cheol.

"Notice of Office Action," mailed Jun. 4, 2007, for U.S. Appl. No. 10/861,743; Filed on Jun. 3, 2004; Inventors: Yoo, Myung Cheol.

"Non-Final Office Action", date mailed Nov. 15, 2007, U.S. Appl. No. 11/165,110; Filed on Jun. 22, 2005; Applicant: Verticle.

"Written Opinion", date mailed Dec. 7, 2007, International Appl. No. PCT/US05/22785; Filed on Jun. 22, 2005; Applicant: Verticle.

"Continuous-Wave Operation of InGaN Multiple-Quantum-Well Laser Diodes on Copper Substrates Obtained by Laser Liftoff," Mar./Apr. 2001, IEEE Journal on Selected Topics in Quantum Electronics, vol. 7, No. 2.

Wong, et al. "Continuous-Wave InGaN Multiple-Quantum-Well Laser Diodes on Copper Substrates," Feb. 26, 2001, Applied Physics Letters vol. 78, No. 9. http://apl.aip.org/apl/copyright.jsp.

"The Integration of $In_xGa_{1-x}N$ Multiple-Quantum-Well Laser Diodes with Copper Substrates by Laser Lift-Off," Dec. 1, 2000, Jpn. J. Appl. Phys. vol. 39 (2000) pp. L 1203-L 1205, Part 2, No. 12A.

"International Search Report", Issued in PCT Appl. No.: PCT/US05/14634; Mailing Date: Aug. 4, 2008.

"Written Opinion", Issued in PCT Appl. No.: PCT/US05/14634: Mailing Date: Aug. 4, 2008.

"International Preliminary Report on Patentability", Issued in PCT Appl. No.: PCT/US/2005/014634; Mailing Date: Sep. 12, 2008.

"International Search Report", Issued in PCT Appl. No.: PCT/US2008/065355; Mailing Date: Sep. 29, 2008.

"Written Opinion", Issued in PCT Appl. No.: PCT/US2008/065355; Mailing Date: Sep. 29, 2008.

* cited by examiner

METHOD OF MAKING VERTICAL STRUCTURE SEMICONDUCTOR DEVICES INCLUDING FORMING HARD AND SOFT COPPER LAYERS

RELATED APPLICATIONS

This application claims the priority right under 35 USC 119(e) from U.S. Provisional Application No. 60/566,322, "Fabrication Method of High Power and High Yield Vertical Structure Compound Semiconductor Devices, filed on Apr. 28, 2004, and also under 35 USC 120 from US Utility application Ser. No. 10/861,743 "Method of Fabricating Vertical Structure Compound Semiconductor Devices, filed Jun. 3, 2004 (pending), which claims priority under 39 USC 119(e) from U.S. Provisional Application No. 60/476,008, "Method of Fabrication and Vertical Structure Compound Semiconductor Devices," filed Jun. 4, 2003, all of which are incorporated herein by reference.

FIELD

The invention is related to fabricate GaN-based vertical structure semiconductor devices having a top and bottom contact structure and a method to fabricate the vertical structure devices.

BACKGROUND

Figure 1:
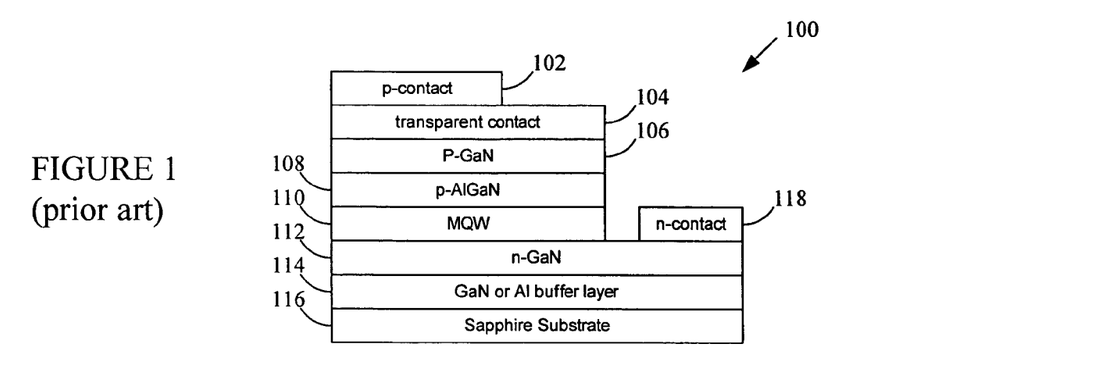
FIG. 1 depicts a lateral structure GaN-based LED with two metal contacts are formed on the topside of device, according to the prior art.

FIG. 1 depicts a conventional Gallium Nitride (GaN)-based semiconductor device 100 fabricated on an insulating sapphire substrate 114. This device can be for applications such as a Light Emitting Diode (LED), Laser Diode (LD), Hetero-junction Bipolar Transistor (HBT) and High Electron Mobility Transistor (HEMT). During the conventional process, the device is formed on a sapphire substrate and both electrical contacts are formed on the top side of the device. A p-contact 102 is formed on the top and mesa etching is employed to remove material to form an n-metal contact 116. The result is called a lateral structure device and tends to exhibit several problems including weak resistance to electrostatic discharge (ESD) and heat dissipation. Both of these problems limit the device yield and useful life time. In addition, the sapphire material is very hard, which creates difficulty in wafer grinding and polishing, and device separation. Device fabrication yield is dependent on post fabrication processes including lapping, polishing, and die separation.

Figure 2:
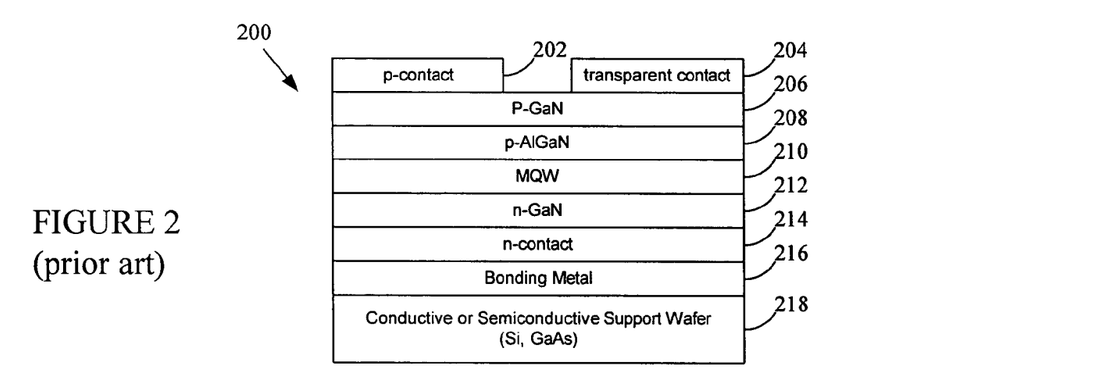
FIG. 2 depicts a vertical structure GaN-based LED where a GaN thin membrane is bonded to a conductive or semi-conductive second substrate, according to the prior art.

FIG. 2 depicts a second conventional technique that has become useful in building vertical structure GaN-based compound semiconductors 200. A laser lift-off (LLO) process is used to remove the sapphire substrate from the GaN epitaxial layer by applying an excimer laser having wavelength transparent to sapphire, typically in the UV range. The devices are then fabricated by substituting the insulating sapphire substrate with a conductive or semi-conductive second substrate 218 to build vertical structure devices. These processes typically employ wafer-bonding techniques for permanent bonding to the second substrate after removing sapphire substrate by laser lift-off.

However, there is still lacking a large scale laser lift-off process for the mass production of VLEDs (Vertical LED). One reason is the difficulty in large area laser lift-off due to non-uniformity of bonding adhesive layer 216 between support wafer 218 and the epitaxial layer 214 and the permanent second substrate 218 since the epitaxial layer surface is not flat over entire wafer surface after laser lift-off. Another problem associated with this wafer bonding technique is the degradation of metal contacts due to high temperature and high pressure during eutectic metal bonding process. Furthermore, substrates such as Si or GaAs used for the permanent wafer bonding are not optimal substrates in terms of heat dissipation compared to a Cu-based metal substrate. These problems reduce the final yield and do not provide a satisfactory solution to mass production of commercially viable devices.

Figure 3:
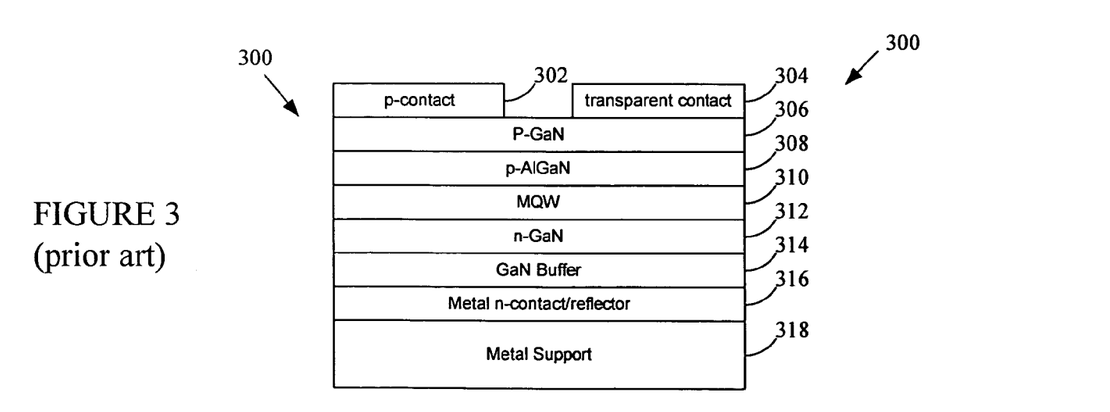
FIG. 3 depicts a vertical structure GaN-based LED where a thick metal layer is attached to a GaN thin membrane after removing original sapphire substrate, according to the prior art.

FIG. 3 depicts a structure 300 intended to overcome the wafer bonding problems and fabricate VLEDs. Instead of using a wafer bonding method, the fabrication of device 300 includes attaching a metal support 318 to the device. However, the yield is known to be low due to de-lamination of the bonding layer during the laser lift-off process. If the bonding is not secure against the high-energy laser shock wave, the GaN epitaxial layers may buckle or crack after laser lift-off, and then it is difficult to perform post laser lift-off processes, such as wafer cleaning, device fabrication, de-bonding and device separation. Consequently, final device process yield is low.

Another problem of a vertical devices based on the technique shown in FIG. 3 is poor device performance. Since a sand blast is used on the sapphire substrate to improve uniform laser beam energy distribution, the GaN surface after laser lift-off is typically rough, which results in less light output than if it were a flat, smooth surface. In addition, the metal reflective layer formed on the n-GaN layer is not as high as non-metallic reflector material, such as ITO.

Due to these limitations of conventional techniques, a new technique is needed that can improve device performance and fabrication yield in high volume production of GaN-based semiconductor devices.

SUMMARY

The invention provides a reliable technique to fabricate a new vertical structure compound semiconductor devices with highly improved light output and the high yield laser lift-off (LLO) processes for mass production of GaN-based compound semiconductor devices. The main theme of this invention is employing direct metal support substrate deposition prior to the LLO by electro-plating method to form an n-side top vertical structure. In addition, ITO DBR layer was employed right next to p-contact layer to enhance the light output by higher reflectivity ITO layer. Perforated metal wafer carrier was also used for wafer bonding for easy handling and de-bonding. A new fabrication process is simple and more reliable process compare to the previous LLO-base vertical device fabrication. The light output of the new vertical device having n-side up structure was increased 2 or 3 times higher than that of the lateral device fabricated with same GaN/InGaN epitaxial films.

An exemplary embodiment of the invention is directed to a method of fabricating semiconductor devices. The invention includes the steps of forming a semiconductor layer over a substrate, forming a metal layer over the semiconductor layer, removing the substrate from the semiconductor layer, forming one or more contacts over the semiconductor layer where the substrate was removed, and separating the semiconductor layer into a plurality of individual semiconductor devices.

In one aspect, the invention includes the step of forming a buffer layer between the semiconductor layer and substrate. In one aspect, the removing step includes the step of applying a laser beam to a interface between the semiconductor layer and substrate, and inserting a diffusing media between the laser source and the substrate. In one aspect, the invention includes the step of attaching a wafer carrier to the metal layer. In one aspect, the separating step includes the step of forming a trench between each of the respective devices, passivating exposed portions of the devices, and transferring the individual semiconductor devices to a support film. In one aspect, the invention includes the step of assembling the individual semiconductor devices to a lead frame using a one-step die bonding and wire bonding technique.

Advantages of the invention include an improved technique for fabricating semiconductor devices with great yield and reliability.

DRAWINGS

The invention is described with reference to the following figures.

FIG. 5 also depicts an AlGaN buffer layer added as a thermal barrier, according to an embodiment of the invention.

DETAILED DESCRIPTION

The invention is described with reference to specific device structure and embodiments. Those skilled in the art will recognize that the description is for illustration and to provide the best mode of practicing the invention. The invention includes a number of forming and depositing steps to fabricate a semiconductor device according to the invention. The disclosure refers to depositing materials over or on other materials, which is described and depicted as representing an arbitrary frame of reference and is intended to describe and cover techniques that deposit materials over-top, on, or below other materials as explained and understood by those of skill in the art and in conjunction with the description. For example, portions of the disclosure describes semiconductors layers constructed from above and other portions describes semiconductor layers constructed from below, while in both cases, a new layer deposited over an existing layer means that it is deposited above or below the existing layer as described and illustrated. Numerous process parameters are provided herein to provide the best mode, while variations of the parameters may also result in the process, structure, and advantages as described herein. Variations of the invention are anticipated and encompassed by the claims.

A. Device Structure and Fabrication

Figure 4:
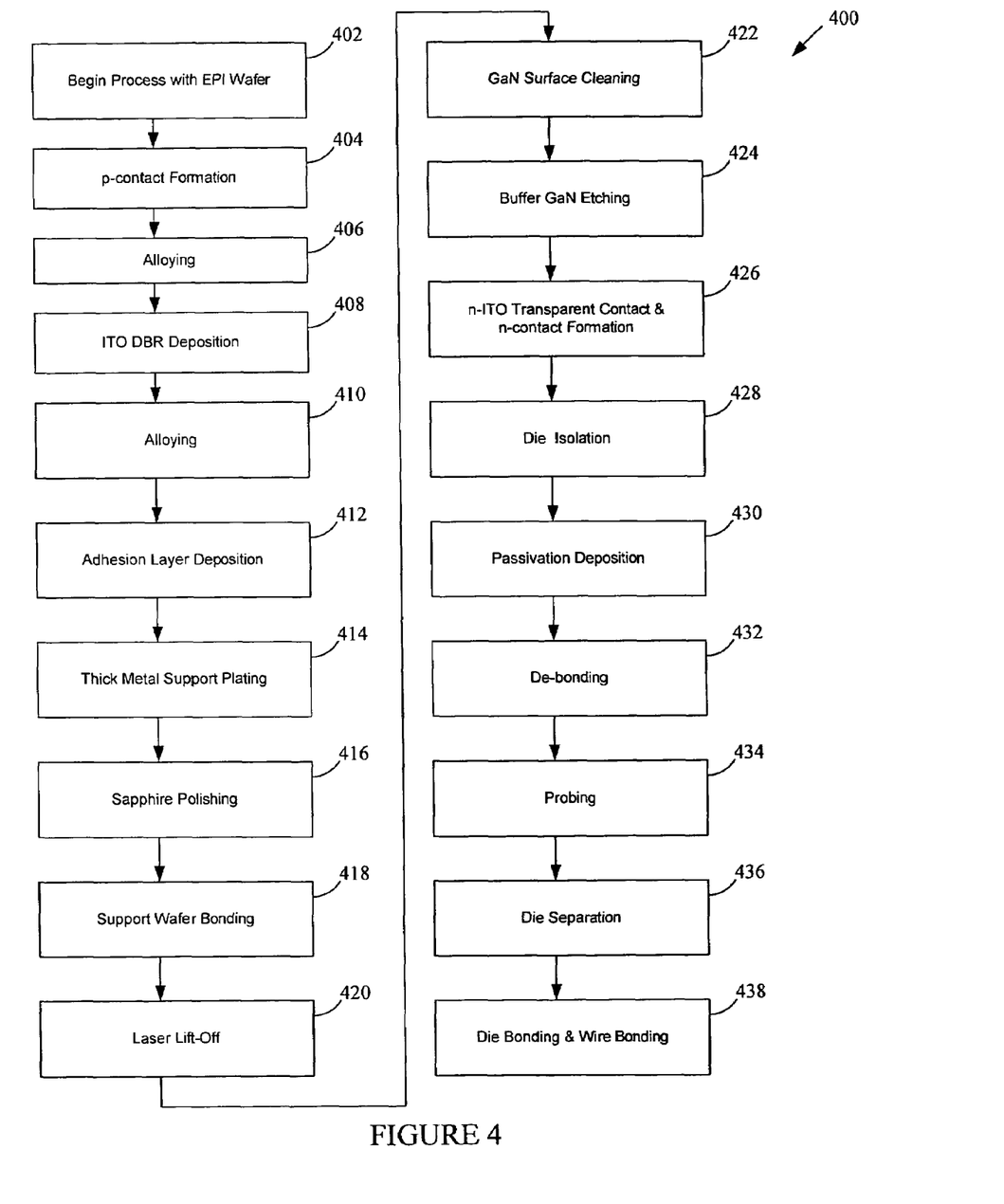
FIG. 4 is a flowchart showing a method of fabricating a semiconductor device according to an embodiment of the invention.
Figure 5:
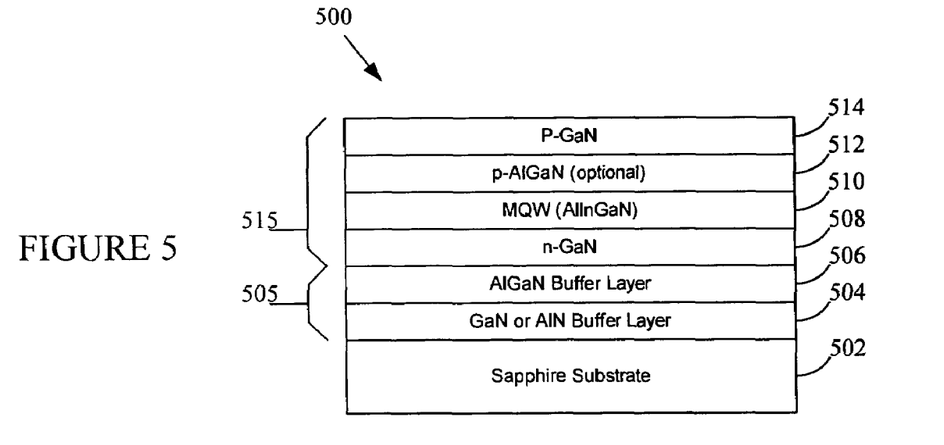
FIG. 5 depicts an epitaxial structure a vertical device where a GaN or AlN buffer layer is grown on top of the sapphire substrate, according to an embodiment of the invention.

FIG. 4 is a flowchart 400 showing a method of fabricating a semiconductor device according to an embodiment of the invention. The steps depicted in the flowchart are for the purpose of demonstrating the exemplary embodiments and structures and the invention includes portions of modifications of the method and resulting structures as set forth herein. Step 402 begins the exemplary process with an epitaxial wafer as depicted in FIG. 5. Reference number 500 is intended to refer to the semiconductor that may result in one or more devices. In the event of many devices, the references are provided with alphabetic suffixes such as 500*a*, 500*b*, 500*c* and so on. The steps are described with reference to the semiconductor structure fabrication and packaging depicted in FIGS. 5-20.

FIGS. 5-18 illustrate steps to fabricate vertical structure GaN-based LEDs, according to embodiments of the invention, using a deposition processes to form a metal substrate for mechanical support and electrical conductivity, and a laser lift-off process to remove the original substrate. The fabrication method described in this invention is not limited to LEDs but can extend to any device structures and particularly those containing GaN-based epitaxial thin films grown on an insulating substrate, such as laser diodes (LD), Hetero-junction Bipolar Transistor (HBT), High Electron Mobility Transistor (HEMT).

FIG. 5 depicts an epitaxial structure a vertical device 500 formed on a substrate 502, for example, a sapphire substrate. A GaN or AlN buffer layer 504 is grown on top of the substrate. In one aspect of the invention, an AlGaN buffer layer 506 is formed over buffer layer 504 to act as a thermal barrier. The combination buffer layer is depicted as reference number 505 and may include one or both layers 504 and 506 as described below.

Next, a GaN-based LED structure 515 represented by numbers 508-514 is grown on the sapphire substrate 502 with an appropriate epitaxial growth apparatus, such as metal organic chemical vapor deposition (MOCVD), molecular beam epitaxy (MBE), vapor phase epitaxy (VPE), or other technique. A n-GaN layer 508 is formed, and then a multi-quantum well (MQW) layer 510 is formed over the n-GaN layer 508. An optional p-AlGaN layer 512 is depicted, and a P-GaN layer is depicted.

Contrary to conventional techniques where a single layer of GaN or AlN is a common buffer layer, the invention preferably employs both AlGaN buffer layer 506 in addition to the GaN or AlN buffer layer 504, but does not require both layers. The AlGaN 506 layer is useful in terms of a thermal barrier. Experiments have shown that the temperature at the interface between GaN LED layer 515 and adhesive bonding layer may increase up to 250° C. during the laser lift-off process. Therefore, a polymer-base adhesive layer may become deteriorated and may react with the GaN LED layer during laser lift-off due to heat build up, which makes it difficult to remove the thermally deteriorated adhesives during the de-bonding process. In the invention, employing AlGaN helps to reduce the bonding adhesive deterioration, hence to improve device fabrication yield. In addition, the total epitaxial layer thickness is set to certain thickness to minimize temperature increase at the GaN/adhesive interface. Beneficially, the epitaxial layer thickness is chosen to be more than 5 µm in order to maintain interfacial temperature less than 200° C. To achieve this, the n-GaN layer is grown more than 4 µm thick on top of GaN or AlN buffer layers.

Figure 6:
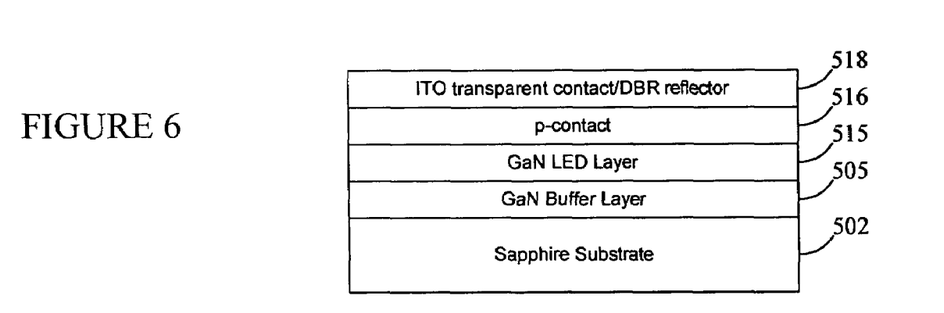
FIG. 6 depicts a p-contact metal and ITO transparent contact/DBR layer deposition on top of p-GaN epitaxial layer to form p-type contact and reflector layer, according to an embodiment of the invention.

FIG. 6 depicts a p-contact metal 516 and ITO transparent contact/DBR layer 518 deposition on top of the GaN LED layer 515 to form p-type contact, deposited using thin film deposition methods, such as, electron beam evaporation or sputtering. Exemplary p-contact metals may include Ni/Au, Pd/Ni/Au, Ni/Pd/Au or Pd/Ir/Au. The thin film metal layer thicknesses can be, for example, 10 nm Ni and 20 nm for Ni/Au, 10 nm Pd and 20 nm Ni, 30 nm Au for Pd/Ni/Au, and 20 nm Ni, 10 nm Pd and 20 nm Ir, 30 nm Au for Pd/Ir/Au, and 20 nm Ni and 20 nm Pd, 100 nm Au for Ni/Pd/Au, respectively. Generally, p-contact metals are annealed in a furnace between 300° C. to 500° C. for 2 min in an oxygen ambient for Ni containing contacts, while non-nickel containing metal contacts are annealed in the nitrogen ambient.

The thin film Indium Tin Oxide (ITO) layer 518 is deposited using electron beam evaporation or sputtering to form a Distributed Bragg Reflector (DBR). Obtaining a good optical reflectivity is important to increase the light extraction in the vertical structure device. In general, oxide-base DBRs are used for the devices demanding photon recovery, such as surface emitting lasers. However, these oxide-base DBR materials are insulator. Therefore, it is useful to employ conductive DBR material for this particular vertical device having conductive metal substrate. ITO is considered the best choice of material for the reflective DBR material in the vertical device with metal substrate, but other choices are anticipated. The reflectivity of ITO is more than 90%, while the best reflectivity of metal thin film is about 50~60%. In one aspect, the ITO thin film thickness is selected to be in the range of 75~150 nm to obtain the optimal reflectivity. The transmittances at 460 nm are over 85% at an annealing temperature in between 300° C. to 500° C.

Figure 7:
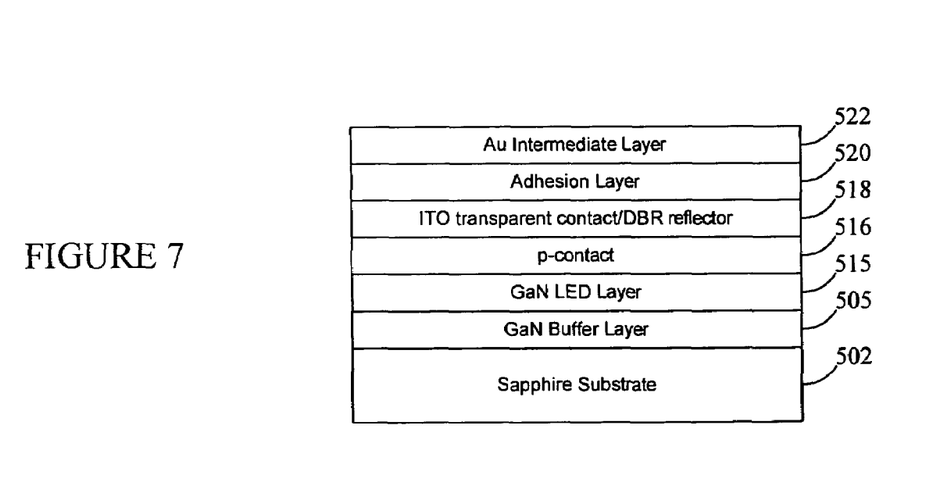
FIG. 7 depicts an adhesion layer deposition to enhance adhesion between the ITO and gold intermediate layer, according to an embodiment of the invention.

FIG. 7 depicts an adhesion layer 520 deposition to enhance adhesion between the ITO layer 518 and gold intermediate layer 522, according to an embodiment of the invention. To fabricate a vertical structure device having a thin, hard GaN epitaxial layer (less than 5 µm) with thick and soft metal film support (~50 µm), it is useful to form an intermediate layer between those two layers to reduce compressive stress build up at the interface between the GaN epitaxial layer and metal layers. Another reason to provide the intermediate layer is that the metallic intermediate layer makes better electroplating characteristics than depositing thick electroplated layers directly on the non-metallic ITO surface. Approximately 1-µm thick gold (Au) thin film was deposited consecutively on the ITO surface using electron beam evaporator without removing wafers from the vacuum chamber. In situ consecutive layer deposition is useful to prevent the oxidation or contaminations, which is important to make a good thin film adhesion between the ITO and Au layers. In order to improve the adhesion between ITO and Au further, 30~50 nm-thick Cr or Ti adhesion layer is deposited in between ITO and Au layers.

Figure 8:
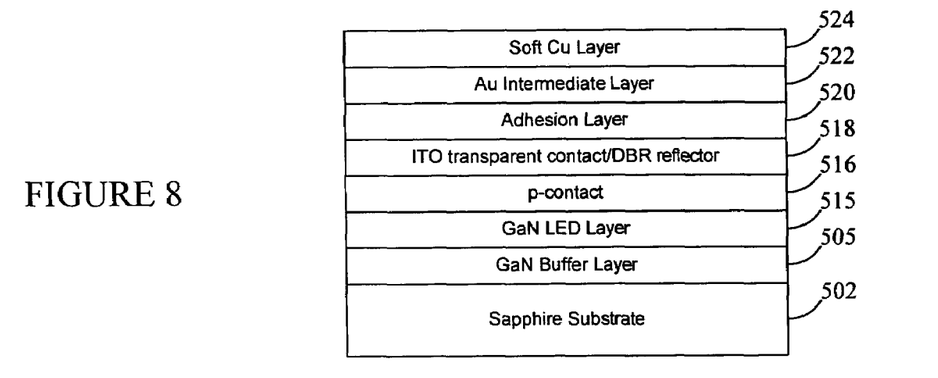
FIG. 8 depicts a soft copper layer deposition using an electroplating or electro-less plating method for stress relief between the GaN LED layer and a subsequently deposited hard copper layer, according to an embodiment of the invention.
Figure 9:
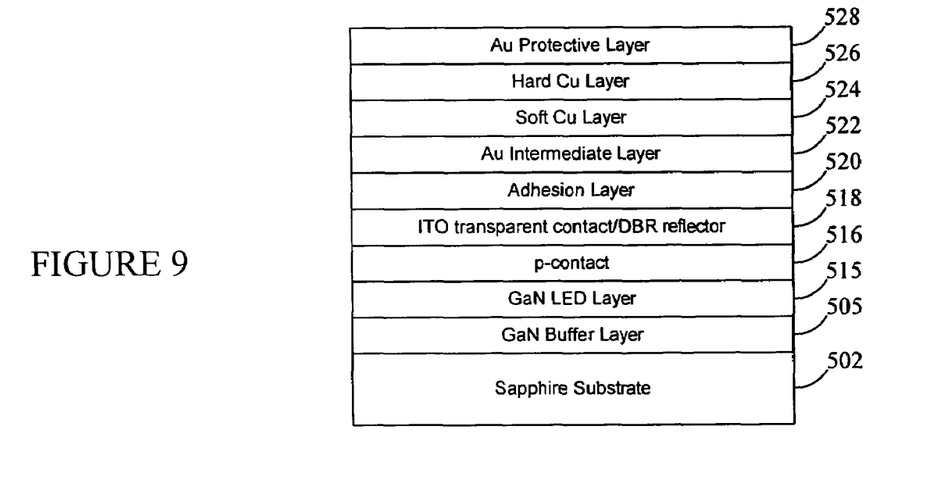
FIG. 9 depicts a hard copper layer deposition using an electroplating or electro-less plating method to provide the mechanical stiffness and higher electrical and thermal conductivity, according to an embodiment of the invention.

In FIGS. 8 and 9, thick metal support layers 524, 526 are deposited by electroplating or electro-less plating. Electroplating or electro-less plating is used because it is typically fast and inexpensive for forming more than 30 µm-thick metal layers, as compared to the other deposition methods. This is particularly useful for mass production of vertical devices in terms of cost effectiveness. Key functions of the metal support layer are that the support layer not only provides a good rigid mechanical support for the thin GaN epitaxial layer 515, but also provides good electrical conductivity and heat dissipation. In order to meet these requirements, graded Cu alloy layers are preferably deposited on an Au/Cr or Au/Ti adhesion layer.

A first Cu strike layer is deposited prior to the Cu alloy layer 524 in order to make a good adhesion between the thin vacuum evaporated Au layer 522 and the Cu alloy layer 524. In one aspect, initially, sulfate-base soft copper layer is plated in order to gradually soften stress build up due to thick metal layer. The initial soft Cu alloy layer thickness is set up to be about 10 µm. The plating rate is set up to 3~5 µm/hour to form a dense and uniform Cu plating layer. Another reason to choose a slow plating rate is to prevent wafer bowing after de-bonding the wafer from the support wafer carrier, described below. Due to the compressive stress build up at the interface between the GaN epitaxial layer 515 and the copper layer 524-526, the wafer may tend to bow after de-bonding. In addition to the slow rate plating, organic-based additives can be added in the electroplating solution and a sulphonate-base plating solution is used. Furthermore, the electroplating is performed at low temperature (5° C.) to minimize stress build up.

Next to the soft Cu layer 524, a hard Cu layer 526 is plated using cyanide or acid-base bath in order to provide structural stiffness. The plating rate of hard Cu plating is about 15 µm/hour. For the Cu alloy plating, the metal alloy plating solutions containing tin (Sn) and iron (Fe) were mixed with the Cu sulfate solution to improve the mechanical strength and the electrical conductivity of the Cu support layer. The total thickness of the Cu alloy support layer 522 was about 50~60 µm. At the end of the Cu alloy plating, 0.3 µm-thick Au layer was electroplated to protect Cu alloy layers from oxidation. This Au protective layer is useful to make a good adhesion between individual die and metal-base epoxy during die bonding and wire bonding process for the packaging of the vertical devices.

After the thick Cu metal support layer 526 was formed by electroplating, the sapphire surface is mechanically polished to make the sapphire surface uniform roughness. The sapphire surface smoothness is important for to control the laser beam energy density distribution and the final surface morphology of the laser lifted GaN surface. The laser beam energy density is strongly dependent on the surface roughness of the sapphire surface. Low laser beam energy is required if the rough sapphire surface is used for LLO process. However, if the surface is rough, the laser lifted GaN surface appears rough since the sapphire surface morphology replicates to the GaN surface after laser lift-off. On the other hand, if the polished surface is used, higher laser beam energy is required. The surface morphology of laser lifted GaN surface is very similar to that of polished sapphire surface. However, higher laser beam usually results in crack generation due to excessive laser beam energy. To obtain the optimal laser lift-off result and the GaN surface morphology, the surface roughness of the sapphire surface is chosen approximately 10~20 angstrom in RMS value.

Figure 10:
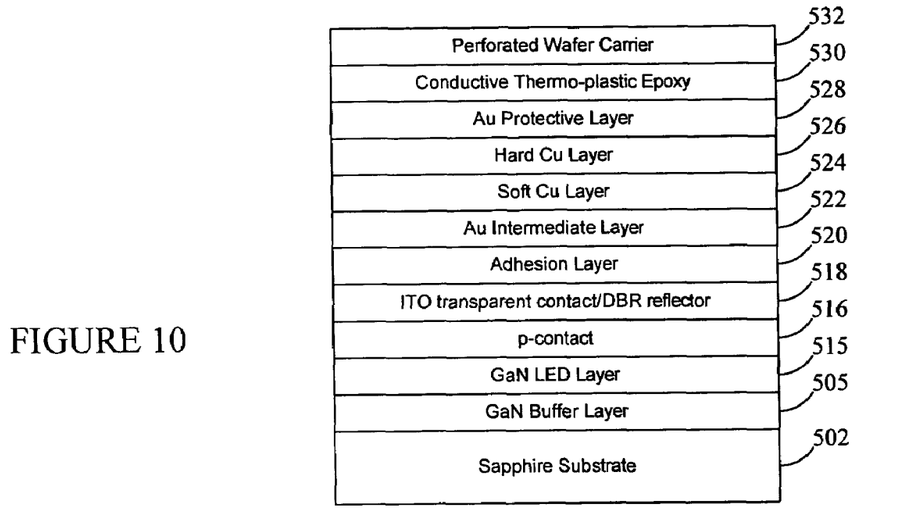
FIG. 10 depicts a copper electroplated or electro-less plated GaN LED wafer attaching to a perforated support wafer carrier using conductive adhesive glue prior to the laser lift-off, according to an embodiment of the invention.

As shown in FIG. 10, Sapphire/GaN/Cu/Au wafers are bonded to a perforated wafer carrier 532 using a conductive thermo-plastic epoxy 530. The perforated wafer carrier is made out of stainless steel with holes. The reason to use the metal wafer carrier is to provide the electrical and heat conduction during the inductively coupled plasma (ICP) etching, wafer probing and die isolation. By using a metal wafer carrier, there is less need to remove wafer from the carrier for post fabrication processing. In addition, the perforated wafer carrier provides bubble-free wafer bonding since air bubbles can escape easily through the holes during the bonding process. It also provides easy de-bonding between the Sapphire/GaN/Cu/Au wafer and the wafer carrier since a solvent can penetrate through the holes during de-bonding process. By using the perforated wafer carrier, the entire process is easy, reliable and simple which leads to high fabrication yield for the fabrication of the vertical devices. The exemplary thickness of wafer carrier is 1/16 inches and the diameter is 2.5 inches. The exemplary total number of holes is 21 and the through hole diameter is 20/1000 inches. The exemplary wafer carrier surface is electro-polished to make mirror like flat surface for the uniform bonding with the adhesive.

Silver-based conductive adhesives are used to bond the Sapphire/GaN/Cu/Au and the perforated wafer carrier. The conductive adhesive is used to provide the good electrical and thermal conduction for the wafer probing and die isolation etching process. The thermo-plastic epoxy has good adhesion strength and good heat resistance. Another advantage of the thermo-plastic epoxy is that it can be dissolved in the solvent, such as acetone, very easily, which is useful for the de-bonding process.

In the invention, a sheet-type thermo-plastic epoxy is employed because the film thickness of the sheet type epoxy is more uniform than that of liquid-base adhesives. The liquid-base adhesives often result in uneven thickness uniformity and bubble formation in the previous bonding process experiences since the spin coating of the liquid-base adhesives generally leads to thicker film formation in the wafer fringe side than that of center area of the wafer. This is a common phenomena for the liquid-base adhesives to obtain thick adhesive layers by multiple spinning. For the bonding of thermo-plastic epoxy, 127 μm-thick sheet-type thermo-plastic epoxy is sandwiched in between thick metal support and perforated wafer carrier. The pressure is set to about 10~15 psi and the temperature is maintained below 200° C. in the hot iso-static press. At these conditions, the bonding time is less than 1 minute. This short bonding time has a definite advantage over to that of liquid-base adhesives, which may require more than 6 hour curing time for the complete curing of the adhesive. The short bonding process time also greatly enhance the productivity of the vertical device fabrication.

Figure 11:
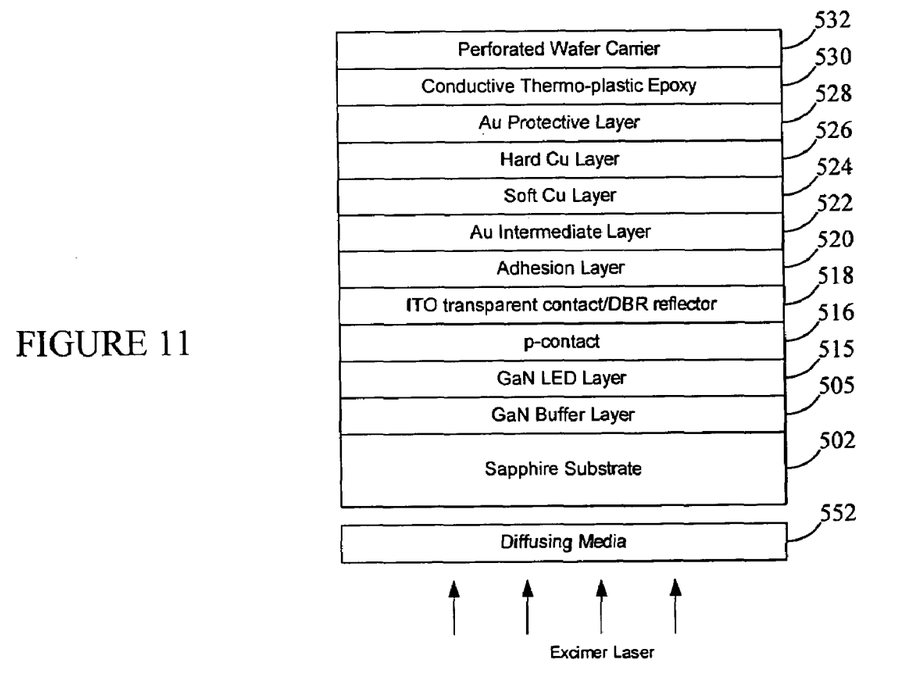
FIG. 11 depicts an eximer laser beam applied through the sapphire substrate using a diffusing media to obtain uniform laser beam energy distribution during laser lift-off process, according to an embodiment of the invention.

Referring to FIG. 11, a 248 nm KrF ultra violet (UV) excimer laser (pulse duration of 38 ns) is used for laser lift-off. The reason for choosing this wavelength is that the laser should beneficially transmit through the sapphire but be absorbed in the GaN epitaxial layer in order to decompose the GaN into metallic Ga and gaseous nitrogen ($N_2$) at the GaN/sapphire interface. The laser beam size is chosen as a 7 mm×7 mm square beam and has beam power density between 600~1,200 $mJ/cm^2$. It is also suggested that the laser beam energy density is dependent on the surface roughness of the sapphire substrate surface. In order to obtain smooth GaN surface after laser lift-off, the beam energy higher than 800 $mJ/cm^2$ was used for the mechanically polished sapphire substrate 10~20 angstrom in RMS value.

Surface roughness of the sapphire substrate is an important process parameter for obtaining a smooth GaN surface after laser lift-off. If un-polished sapphire surface is used during laser lift-off, the GaN surface is rough, which results in poor light output of the LED device due to poor reflectivity of the rough surface after forming a final device. However, if a polished surface is used, a smooth GaN surface can be obtained, hence higher light output can be obtained. However, since the laser beam is localized on the polished sapphire surface, the area irradiated with the higher laser beam power may result in cracking on the GaN surface compared to the area with less laser beam energy. Therefore, it is important to choose an optimal surface roughness of sapphire wafer in order to obtain a high yield laser lift-off process and a high device performance at the same time. According to conventional techniques, sand blasting is commonly used to obtain uniform laser beam distribution on the polished sapphire surface, however, sand blasting is unreliable and unrepeatable to obtain the identical surface roughness consistently. In the invention, a diffusing media 552 constructed from materials transparent to the 248 nm UV laser is placed in between laser beam and sapphire substrate to obtain uniform laser beam energy distribution on the sapphire surface, hence to enhance the laser lift-off process yield. The rms (root mean square) surface roughness of the diffusing media is set up less than 30 μm and sapphire was used for the diffuser.

Figure 12:
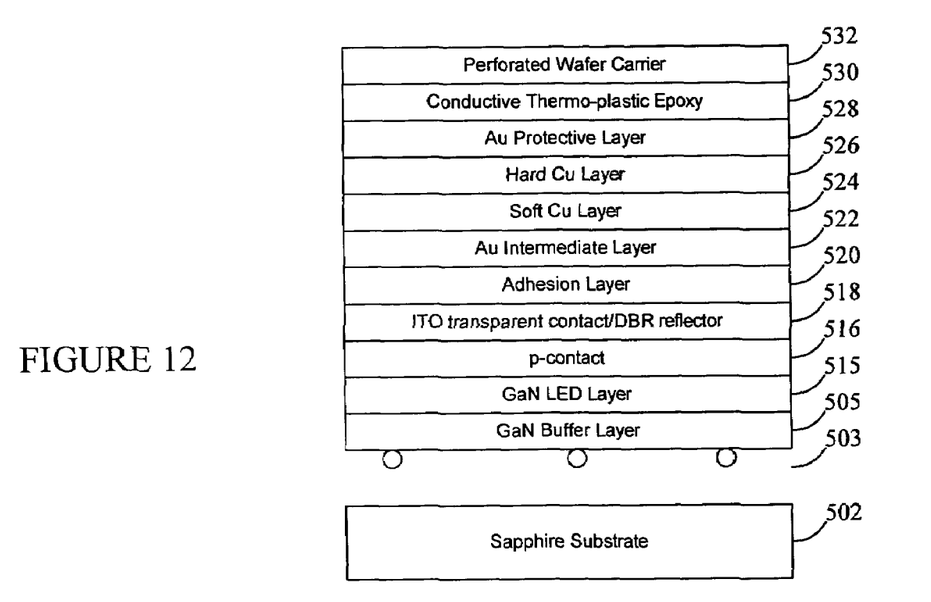
FIG. 12 depicts the sapphire substrate removal and Ga drop cleaning after laser lift-off, according to an embodiment of the invention.

Referring to FIG. 12, after laser lift-off, excess Ga drops 503 result from GaN decomposition during laser lift-off, and is cleaned with an HCl solution ($HCl:H_2O=1:1$, at room temperature) or boiled using HCl vapor for 30 seconds. Since the Ga melts at room temperature, Ga is formed in a liquid state during the laser lift-off; hence it can be easily cleaned with chlorine-base acidic solutions.

Figure 13:
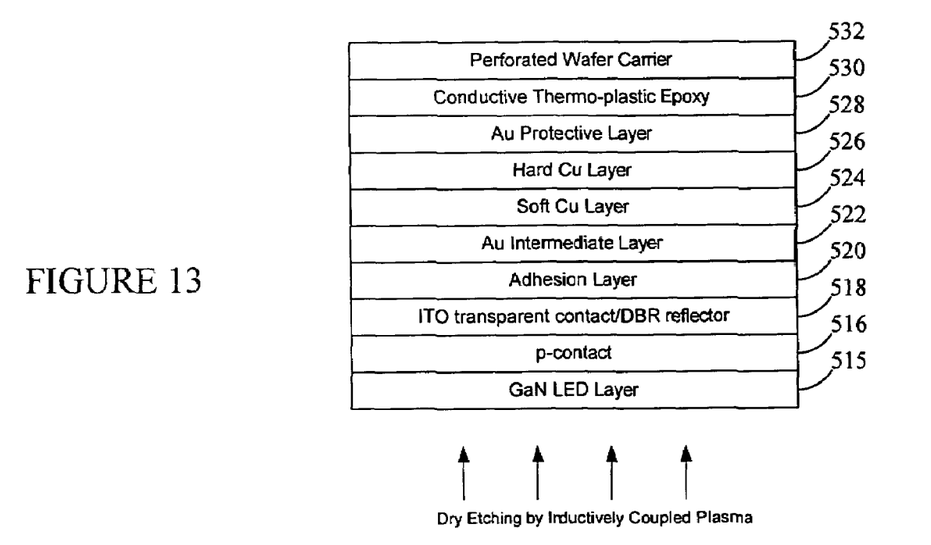
FIG. 13 depicts GaN/AlGaN buffer layer removal by dry etching and GaN surface smoothing etching prior to n-contact formation, according to an embodiment of the invention.

Referring to FIG. 13, in order to expose n-type GaN epitaxial layer, the buffer layer 505 (e.g. GaN or AlN and AlGaN buffer layers) are removed by dry etching; beneficially using inductively coupled reactive ion etching (ICP RIE). To make an atomically flat surface, ICP polishing is also performed on the n-GaN surface. The flat surface is important in producing high reflectivity from a reflective structure that is deposited subsequently since the light out-put can be increase with higher reflective surface.

Figure 14:
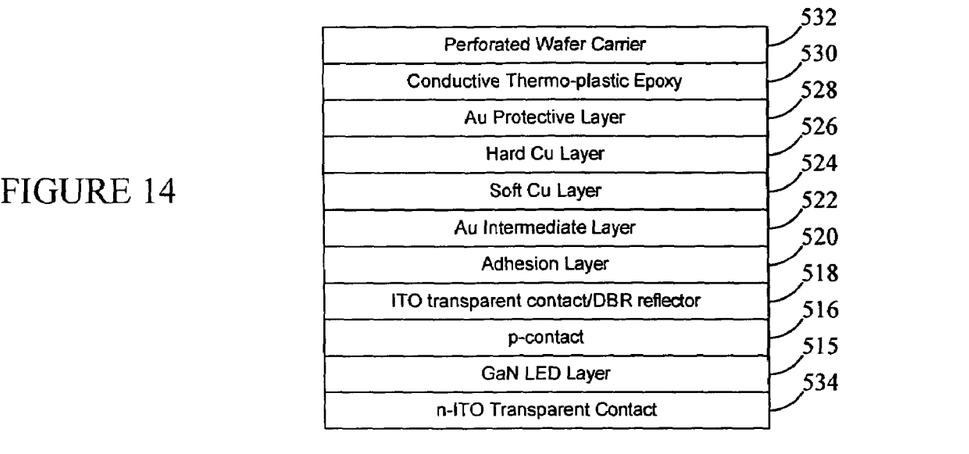
FIG. 14 depicts an n-type ITO transparent contact formation on top of the GaN LED layer, according to an embodiment of the invention.

Referring to FIG. 14, in order to improve the current spreading of the vertical device, an n-type ITO transparent contact 534 is formed on the n-GaN LED surface 515. ITO composition is 10 wt % $SnO_2$/90 wt % $In_2O_3$, and a layer of about 75~200 nm-thick ITO film is deposited using an electron beam evaporator or sputtering system at room temperature. Annealing is carried out after the ITO film deposition in a tube furnace with $N_2$ ambient for 5 minutes. The annealing temperatures are varied in between 300° C. to 500° C. The minimum resistivity of the ITO film is about low $10^{-4}$ Ωcm at 350° C. of annealing temperature in $N_2$ ambient. The transmittances at 460 nm are over 85% at the annealing temperature of above 350° C.

Figure 15:
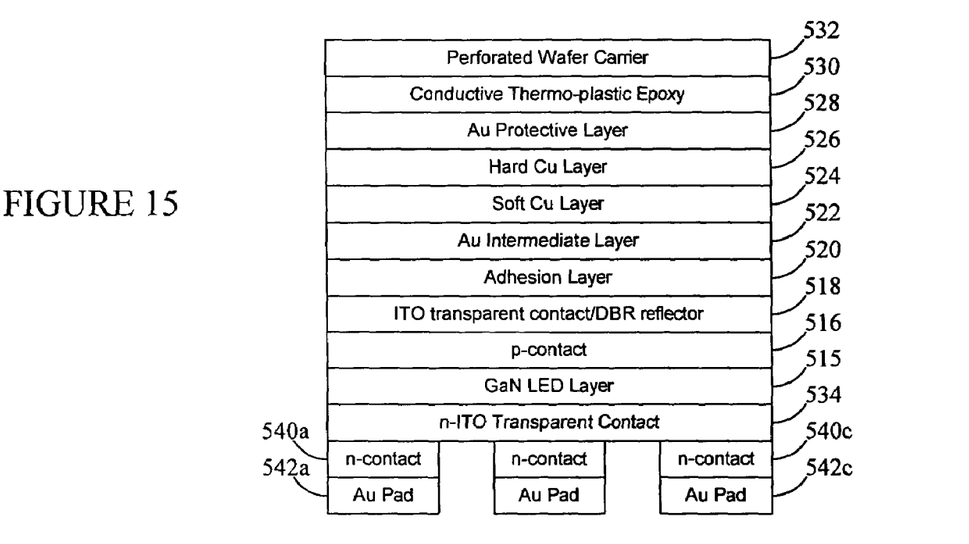
FIG. 15 depicts an n-contact formation and gold pad metallization on the n-ITO layer, according to an embodiment of the invention.

Referring to FIG. 15, after the ITO transparent contact formation, an n-contact 540 is formed on the n-ITO surface, comprising of Ti and Al. Since multiple contacts are formed, they are referenced as 540a, 540b, 540c and so forth. The thickness of the n-contact metal is 5 nm for Ti, and 200 nm for Al, respectively. In order to make a good adhesion between the n-contact metal layer and a pad metal 542, 20 nm of Cr is deposited on top of the Al as an adhesion layer. For the pad metal deposition, 500 nm gold is deposited on top of the Cr consecutively in an electron beam evaporation chamber without breaking vacuum. In order to form an ohmic contact, the n-contact metal is annealed in the furnace at 250° C. for 10 minute in an $N_2$ ambient atmosphere.

Figure 16:
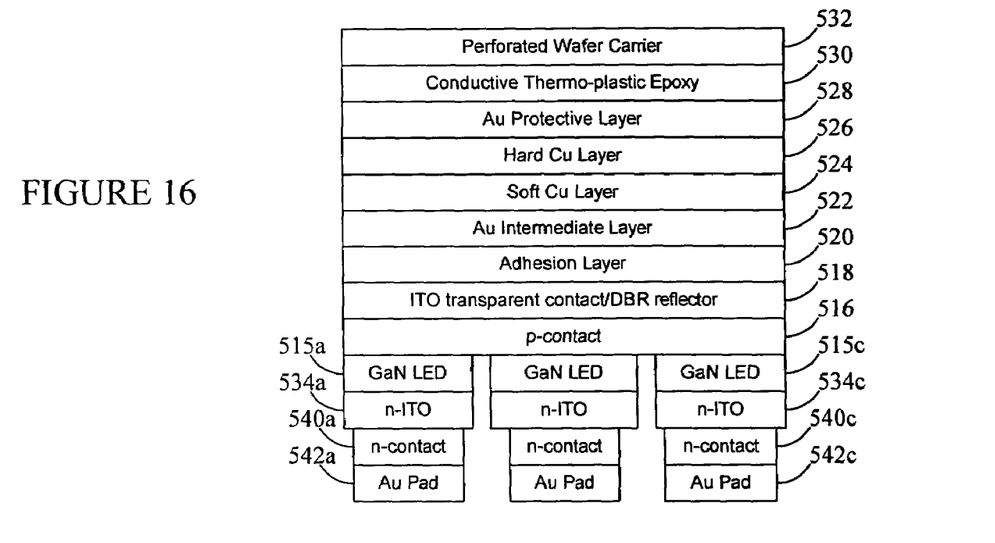
FIG. 16 depicts device isolation by dry etching or mechanical methods such as mechanical scribing or laser scribing, according to an embodiment of the invention.

Referring to FIG. 16, after cleaning the GaN surface, individual devices are isolated by a MICP (magnetized inductively coupled plasma) dry etching technique. The MICP can accelerate the etch rate compared with the other dry etching methods. This is useful to prevent the photo-resist mask burning during the etch process. The MICP usually provides about twice the etch rate compared to conventional ICP. Fast etch rate is recommended for the processing of the vertical devices having metal support since the metal substrate can be attacked by chemicals designed for removing metal or oxide masks. Therefore, in order to use the photo-resist mask for the die isolation etching, fast etching technique is suggested. The isolation trench dimension is 30 μm wide and 3.5 μm deep the etch depth is dependent upon epitaxial wafer thickness. Suggested MICP dry etch conditions for device isolation are as follows:

1. Total flow rate: 100 sccm
2. Intensity of magnet field: 15 gauss
3. Substrate temperature: 70° C.
4. Gas mixture: 40% $BCl_3$/40% $Cl_2$/20% Ar
5. Power/bias voltage: 600 W/−300V
6. Operational pressure: 30 mTorr
7. Etch depth rate: 0.4 μm/min
8. Etch mask: Photo-resist (AZ 9262) (thickness: 24 μm)

The die isolation is also carried out either by mechanical dicing or laser scribing. The dicing trench for device isolation is 50 μm wide in the case of laser scribing and 40 μm in the case of mechanical dicing. The trench depth is approximately 10 μm-deep in both cases.

Figure 17:
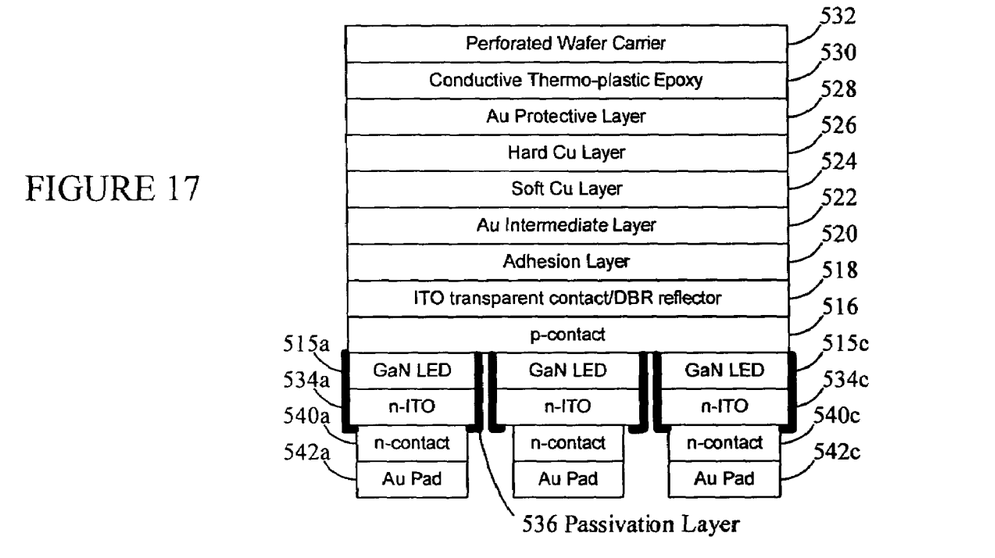
FIG. 17 depicts a protective $SiO_2$ passivation layer deposition, according to an embodiment of the invention.

Referring to FIG. 17, a passivation layer 536 is deposited on exposed portions of the devices. In order to protect device from the external hazardous environment and to increase the light output by modulating reflective index between the passivation layer and the GaN, the vertical device is passivated with a $SiO_2$ thin film 536. The film is deposited with PECVD (Plasma Assisted Chemical Vapor Deposition) at less than 250° C. The film thickness is maintained at 80 nm for the optimal reflective index.

Figure 18:
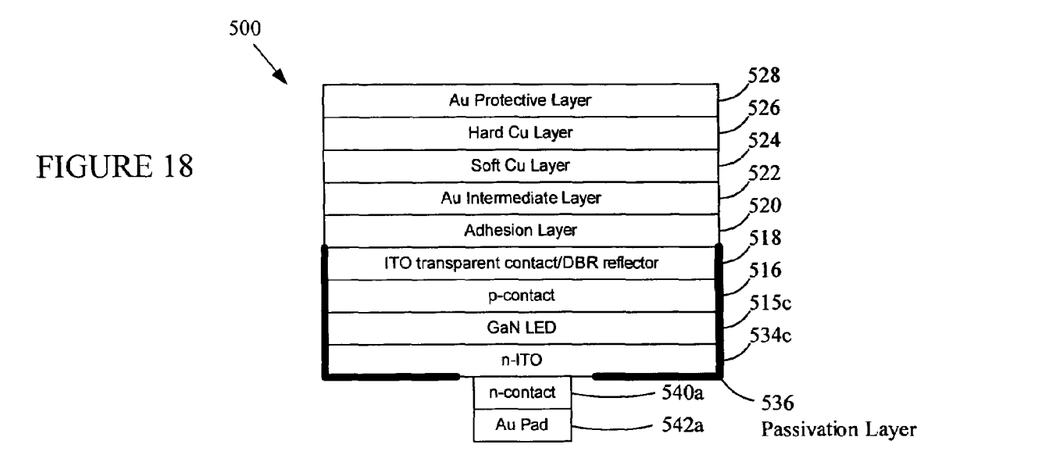
FIG. 18 depicts support wafer carrier removal and final device structure, according to an embodiment of the invention.

Referring to FIG. 18, after the passivation deposition, the perforated support wafer carrier is removed from the GaN/metal support wafer using solvent. The de-bonding process includes soaking of the GaN/metal wafer in acetone for 0.5~1 hour to dissolve the conductive adhesive layer from the perforated support wafer carrier. The separated GaN/metal wafers are further soaked and cleaned with isopropanol in an ultrasonic cleaner. The GaN device surface is further cleaned with DI water using rinse and dryer.

Figure 19:
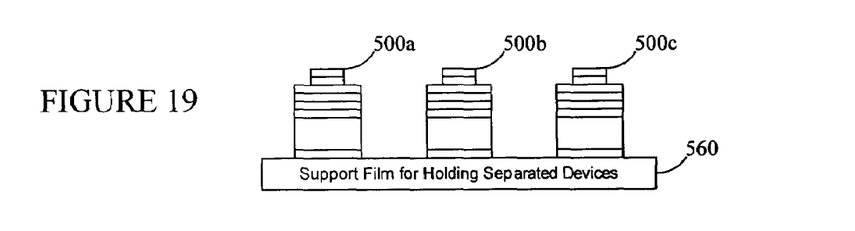
FIG. 19 depicts device separation by dicing or laser scribing, according to an embodiment of the invention.

Referring to FIG. 19, in order to separate individual device from the wafer, the devices are diced out by laser scribing using an Nd;YAG laser. The wafer having vertical devices with a metal substrate is placed on porous vacuum chuck. The Nd;YAG laser is focused on the 30 μm-wide trenches formed with MICP. After laser scribing is completed, the separated chips are transferred to tacky wafer grip tape. Prior to the pick and place process, the separated chips are flipped from the first wafer grip to another wafer grip 560, so that the GaN surface is located on top of the device.

Figure 20:
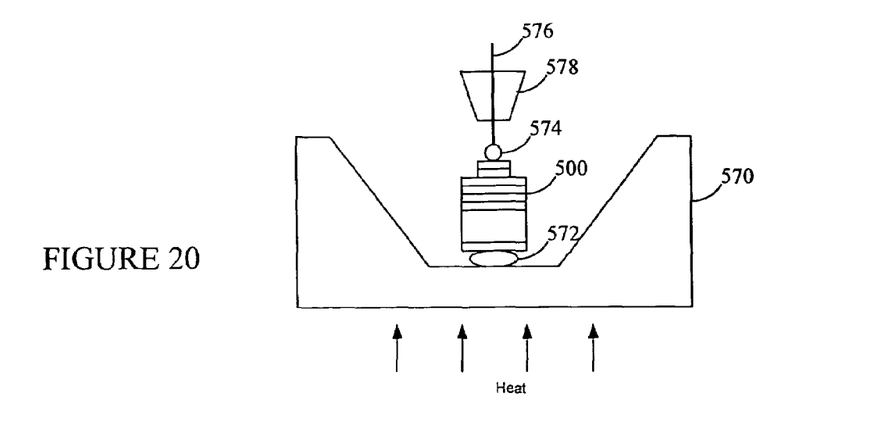
FIG. 20 depicts die bonding and wire bonding of vertical device on the lead frame, according to an embodiment of the invention.

FIG. 20 depicts a wire bonding process with a final device 500, where reference number 570 is a lead frame, 572 is a gold bump, 574 is a gold ball, 576 is gold wire and 578 is a wire bonding device. Contrary to the conventional lateral device, the metal supported vertical device 500 is handled using a special die bonding technique. In the invention, the one-step die bonding and wire bonding technique is employed as shown in FIG. 20. Instead of separating the die bonding and wire bonding processes, the separated single chip is placed on the lead frame having with gold bump on the lead frame surface. By heating and pressurizing action, the gold bump can connect together with the gold surface of the vertical device and the silver coated lead frame at once. Therefore, there is no need to perform the separate die bonding and wire bonding processes. This one-step process helps to reduce process time and provides an easy and simple packaging processes, hence reduce the fabrication cost and time. While this exemplary packaging technique is depicted, other packaging technique can be used in the invention.

B. Exemplary Points of Interest and Advantages

The points and advantages herein are intended as examples and not to limit the points or advantages of the invention.

1. Exemplary Device Points a. Higher light output due to better current spreading through n-GaN layer, which has higher carrier concentration than that of p-GaN. The electron concentration (carrier concentration) of the n-GaN is known to be in the range of $10^{19}/cm^3$, which is two orders of magnitude higher than that of hole concentration in p-GaN ($\sim 10^{17}/cm^3$). Therefore, more photons can be generated through the n-GaN layer upon current injection to the p-n junction. The light output of the new vertical device having n-side up structure was increased 2 or 3 times higher than that of the lateral device having p-side up structure produced with same GaN/InGaN epitaxial layers.

b. Higher heat dissipation due to metal substrate. The metal substrate of the vertical structure device gives superior electrical and heat conduction, which is useful in terms of device efficiency and reliability, i.e. device life-time.

c. Higher number of devices can be obtained since the device dimensions are shrinking because of only one metal contact pad is required with vertical device compare to the lateral structure. Vertical structure requires only one contact on top side, while the lateral device having insulating substrate requires two contacts. As a result, about 1.5 to 2 times more devices can be obtained from the vertical device than those from lateral device.

d. Higher power efficiency can be obtained from the vertical device. There is no current crowding in the vertical device; hence the light output is linear with current injection. On the other hand, the maximum light output of a lateral device is saturated earlier due to current crowding effects. This is important for the high power devices, such as white LED for solid state lighting.

e. Vertical devices can withstand a high electrostatic discharge (ESD) environment compared to lateral devices; in general the ESD resistance of a vertical device with metal substrate is higher than 10,000 V, while that of lateral device is around 100 V. This is important for devices used in automobile applications since the devices are often exposed to a high voltage environment.

2. Exemplary Process Points a. Due to the higher adhesion strength of the metal substrate directly attached to the GaN epitaxial layer by metal deposition, such as electro-plating, the de-bonding between the support substrate and the GaN epitaxial layer can be significantly suppressed during high energy shock wave irradiation by laser beam. As a result, crack initiation can be maintained in a minimal extent during the laser lift-off process. The result is higher laser lift-off (LLO) yield rate compared with the previous polymer-base bonding processes, such as epoxy or glue bonding, which result in higher probability of crack initiation and generation during LLO due to poor adhesion strength between the support and the GaN epitaxial layer.

b. As a result, the new invention ensures more robust and reliable LLO process compared with the previous wafer bonding or glue bonding-based LLO processes. By achieving the full wafer scale laser-lift-off processes, the invention provides the realistic production-ready technology for mass production of vertical structure devices.

c. Simple and easier device fabrication and LLO process; reduced number of mask for front fabrication process is required.

3. Exemplary Advantages a. Instead of metal bonding, a metal support substrate is deposited by electroplating or electro-less plating.

b. Instead of post LLO metal support layer deposition, a metal support layer is preformed prior to the LLO process.

c. No trenches are formed on the GaN epitaxial layer, which results in no crack generation during LLO process and reduce the number of fabrication steps.

d. n-contact is situated on top of the device for higher light output.

e. No transparent p-contact layer is employed; instead ITO transparent n-contact is formed on n-GaN for better current spreading.

f. ITO DBR layer is employed next to a p-contact layer to enhance the light output by higher reflectivity ITO layer.

g. Perforated metal wafer carrier is used for wafer bonding for easy handling and de-bonding.

h. A new fabrication process is straight-forward and more reliable compares to conventional LLO-base vertical device fabrication.

C. Conclusion

Advantages and exemplary embodiments of the invention have been disclosed and described herein. Accordingly, having disclosed exemplary embodiments and the best mode, modifications and variations may be made to the disclosed embodiments while remaining within the subject and spirit of the invention as defined by the following claims.

The invention clamied is:

1. A method of fabricating semiconductor devices, comprising the steps of:
   forming a plurality of semiconductor layers over an insulated substrate, at least one of said plurality of semiconductor layers comprises GaN;
   forming a plurality of metal support layers deposited using electroplating including a copper layer plated using cyanide or acid-base bath and a sulfate-base copper alloy layer over a first side of said plurality of semiconductor layers;
   removing said insulated substrate from said plurality of semiconductor layers;
   forming one or more electrical contacts, after said insulated substrate was removed, over a second side of said plurality of semiconductor layers wherein said second side is opposite said first side; and
   separating said plurality of semiconductor layers into a plurality of individual semiconductor devices.

2. The method of claim 1, further comprising the step of:
   forming a buffer layer between said plurality of semiconductor layers and said insulated substrate.

3. The method of claim 1, wherein;
   said removing includes applying a laser beam to an interface between said plurality of semiconductor layers and said insulated substrate, and inserting a diffusing media between a laser source that produces said laser beam and said insulated substrate for uniform laser beam energy distribution.

4. The method of claim 1, further comprising the step of:
   attaching a perforated wafer carrier to said plurality of metal support layers.

5. The method of claim 2, further comprising the step of:
   attaching a perforated wafer carrier to said plurality of metal support layers.

6. The method of claim 3, further comprising the step of:
   attaching a perforated wafer carrier to said plurality of metal support layers.

7. The method of claim 2, wherein:
   said separating includes forming a trench between two devices of said plurality of individual semiconductor devices, passivating exposed portions of said plurality of individual semiconductor devices, and transferring said plurality of individual semiconductor devices to a support film.

8. The method of claim 2, further comprising the step of:
   assembling at least one of said plurality of individual semiconductor devices to a lead frame using a one-step die bonding and wire bonding technique.

9. The method of claim 7, further comprising the step of:
   assembling at least one of said plurality of individual semiconductor devices to a lead frame using a one-step die bonding and wire bonding technique.

10. A method of fabricating a light emitting semiconductor device, comprising the steps of:
    forming a diode structure over a substrate;
    forming a plurality of metal layers over a first side of said diode structure;
    forming an Indium Tin Oxide (ITO) layer including a copper layer plated using cyanide or acid-base bath and a sulfate-base copper alloy layer over said diode structure;
    removing said substrate from said diode structure;
    forming one or more contacts over a second side of said diode structure where said substrate was removed, said second side being opposite said first side; and
    separating said diode structure into a plurality of individual diodes wherein said removing includes applying a laser beam to an interface between said diode structure and said substrate, inserting diffusing media between a laser source that produces said laser beam and said substrate, and liquefying at least a portion of a first buffer layer formed over said substrate.

11. The method of claim 10, wherein the said forming the said diode structure comprises the steps of:

depositing said first buffer layer including one of CaN and AlN over said substrate; and depositing a n-GaN layer over said first buffer layer.

12. The method of claim 10, wherein said forming said diode structure comprises the steps of:

depositing said first buffer layer including one of GaN and AlN over said substrate;

depositing a second buffer layer including AlGaN over said substrate; and depositing a n-GaN layer over said second buffer layer.

13. The method of claim 10, wherein:

said separating includes forming a trench between two diodes of said plurality of individual diodes, passivating exposed portions of said plurality of individual diodes, and transferring said plurality of individual diodes to a support film.

14. The method of claim 10, further comprising the step of:

attaching a wafer carrier to said plurality of metal layers.

15. A method of fabricating semiconductor devices, comprising:

forming a GaN-containing layer over a substrate;

forming a p-type ITO layer, said p-type ITO layer being disposed toward a first side of said GaN-containing layer;

forming a metal support layer, said metal support layer being disposed toward said first side of said GaN-containing layer, said metal support layer being deposited using electroplating including a copper layer plated using cyanide or acid-base bath and a sulfate-base copper alloy layer, wherein said p-type ITO layer is disposed between said GaN-containing layer and said metal support layer;

removing said substrate front said GaN-containing layer;

forming one or more electrical contacts, after said substrate was removed, toward a second side of said GaN-containing layer, wherein said second side is opposite said first side.

16. The method of claim 15, further comprising forming a buffer layer between said GaN-containing layer and said substrate.

17. The method of claim 15, wherein said removing includes applying a laser beam to an interface between said GaN-containing layer and said substrate, and inserting a diffusing media between a laser source that produces said laser beam and said substrate for uniform laser beam energy distribution.

18. The method of claim 15 further comprising forming a plurality of individual devices by creating trenches between at least two of said electrical contacts and passivating exposed portions of said plurality of individual devices after said creating.

19. The method of claim 18, further comprising assembling at least one of said plurality of individual devices to a lead frame using a one-step die bonding and wire bonding technique.

20. The method of claim 15 wherein said one or more electrical contacts includes n-contacts.

21. The method of claim 15 wherein said one or more electrical contacts includes n-ITO contacts.

* * * * *